US010424549B2

(12) United States Patent
Kuo et al.

(10) Patent No.: US 10,424,549 B2
(45) Date of Patent: Sep. 24, 2019

(54) TRENCH STRUCTURE AND METHOD (71) Applicant: TAIWAN SEMICONDUCTOR MANUFACTURING COMPANY, LTD., Hsinchu (TW)

(72) Inventors: Fu-Chiang Kuo, Hsinchu (TW); Shih-Chi Kuo, Yangmei (TW); Tsung-Hsien Lee, Tainan (TW); Ying-Hsun Chen, Taoyuan (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 16/173,385

(22) Filed: Oct. 29, 2018

(65) Prior Publication Data
US 2019/0067215 A1 Feb. 28, 2019

Related U.S. Application Data (62) Division of application No. 15/626,681, filed on Jun. 19, 2017, now Pat. No. 10,115,679.

(51) Int. Cl.
| H01L 23/31 | (2006.01) |
| H01L 23/00 | (2006.01) |
| H01L 23/58 | (2006.01) |
| H01L 23/522 | (2006.01) |
| H01L 23/528 | (2006.01) |
| H01L 23/544 | (2006.01) |
| H01L 21/56 | (2006.01) |
| H01L 23/29 | (2006.01) |
| H01L 21/78 | (2006.01) |
| H01L 23/532 | (2006.01) |
| H01L 51/52 | (2006.01) |

(52) U.S. Cl.
CPC ............ *H01L 23/562* (2013.01); *H01L 21/56* (2013.01); *H01L 21/78* (2013.01); *H01L 23/291* (2013.01); *H01L 23/3171* (2013.01); *H01L 23/3192* (2013.01); *H01L 23/528* (2013.01); *H01L 23/5226* (2013.01); *H01L 23/544* (2013.01); *H01L 23/585* (2013.01); *H01L 23/53214* (2013.01); *H01L 23/53228* (2013.01); *H01L 23/53257* (2013.01); *H01L 23/53271* (2013.01); *H01L 51/5243* (2013.01); *H01L 51/5246* (2013.01); *H01L 2223/5446* (2013.01)

(58) Field of Classification Search
CPC ............ H01L 51/5243; H01L 51/5246; H01L 23/291; H01L 23/3192
See application file for complete search history.

(56) References Cited

U.S. PATENT DOCUMENTS

| 4,686,559 A | 8/1987 | Haskell |
| 7,456,507 B2 | 11/2008 | Yang |
| 2003/0008493 A1 | 1/2003 | Lee |

(Continued)

*Primary Examiner* — George R Fourson, III
(74) *Attorney, Agent, or Firm* — Hauptman Ham, LLP (57) ABSTRACT A method of forming a trench structure is provided. The method includes depositing a silicon carbide (SiC) layer on a top metal layer, forming a first passivation layer on the SiC layer, removing a portion of the first passivation layer to form a first opening, forming a second passivation layer on the first passivation layer, the second passivation layer including a first portion in the first opening, and forming a second opening by removing a part of the first portion of the second passivation layer. The forming the second opening exposes the top metal layer.

20 Claims, 5 Drawing Sheets

(56) References Cited

U.S. PATENT DOCUMENTS

| | | |
|---|---|---|
| 2005/0070086 A1 | 3/2005 | Isono |
| 2008/0315418 A1 | 12/2008 | Boyd et al. |
| 2010/0016928 A1 | 1/2010 | Zdeblick et al. |
| 2014/0116760 A1 | 5/2014 | Wang |
| 2014/0167249 A1 | 6/2014 | Zhou |
| 2015/0115404 A1 | 4/2015 | Hsueh et al. |
| 2017/0170112 A1 | 6/2017 | Eguchi |

TRENCH STRUCTURE AND METHOD

PRIORITY CLAIM

This application is a divisional of U.S. application Ser. No. 15/626,681, filed Jun. 19, 2017, which is incorporated herein by reference in its entirety.

BACKGROUND

Integrated circuits (ICs) are commonly formed on substrates as individual dies separated by scribe lines. Manufacturing operations often include cutting along the scribe lines to separate the substrate into the individual dies.

To protect ICs from stress-induced cracking during cutting operations, dies containing the ICs often include protective structures. One such structure is a seal ring surrounding an IC along a perimeter of a die. In some cases, a trench structure over some or all of the seal ring acts as a stress buffer for the IC.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In various embodiments, a trench structure includes a top metal layer of a seal ring, a silicon carbide (SiC) layer directly overlying the top metal layer, and at least one sidewall that includes the SiC layer between the top metal and one or more passivation layers. Compared to trench structures that do not include the SiC layer, the various embodiments provide improved adhesion of the one or more passivation layers to the top metal layer through the use of the SiC layer.

Figure 1:
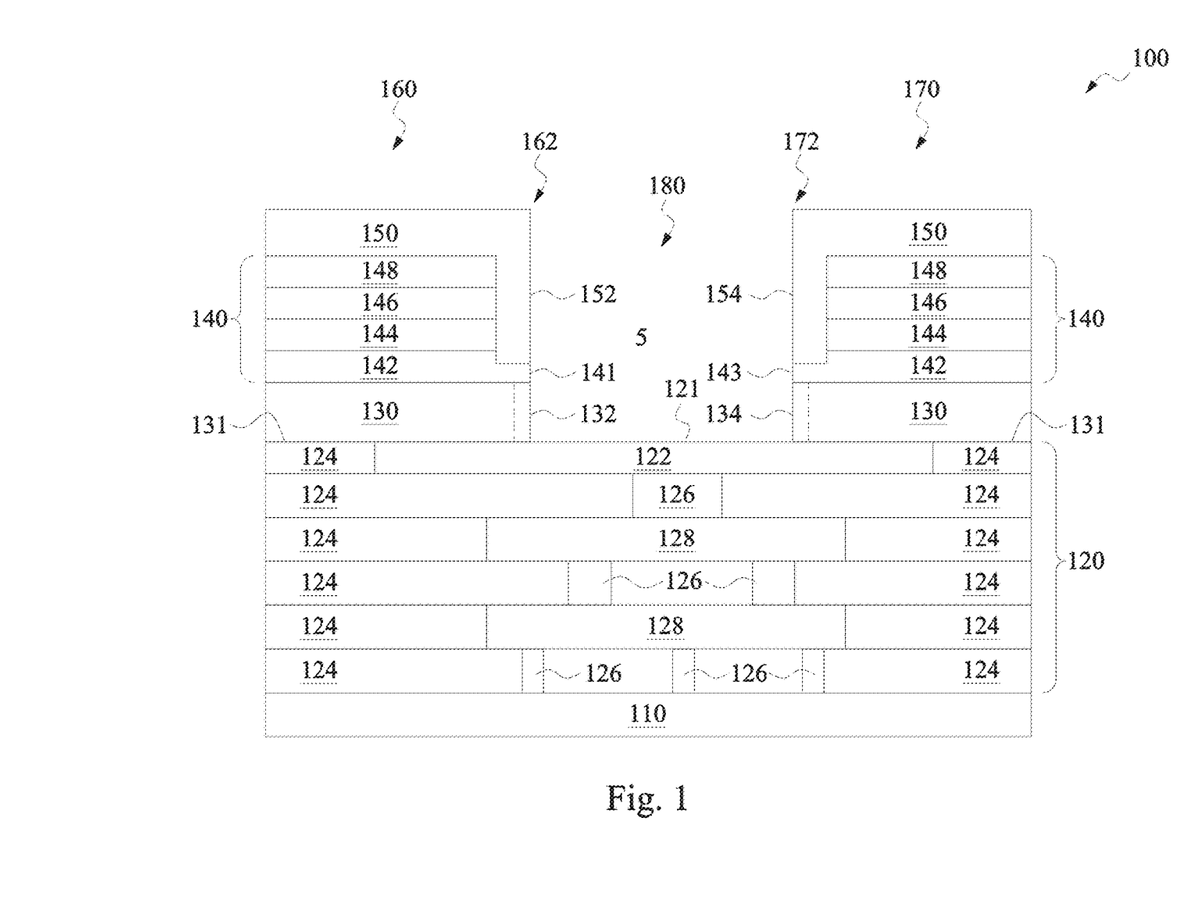
FIG. 1 is a diagram of a trench structure, in accordance with some embodiments.

FIG. 1 is a diagram of a trench structure 100, in accordance with some embodiments. In some embodiments, trench structure 100 is also known as a seal ring structure. FIG. 1 depicts a cross-sectional view of trench structure 100 and a substrate 110, upon which trench structure 100 is positioned.

Trench structure 100 includes a seal ring 120 on substrate 110, a SiC layer 130 overlying seal ring 120, a passivation layer 140 overlying SiC layer 130, and a passivation layer 150 overlying passivation layer 140.

Seal ring 120 includes a top metal layer 122 having a top surface 121. SiC layer 130, passivation layer 140, and passivation layer 150 are arranged as a passivation stack 160 including a sidewall 162 and a passivation stack 170 including a sidewall 172. Top surface 121, sidewall 162, and sidewall 172 form a trench 180.

Substrate 110 includes one or more of silicon, gallium arsenide, silicon germanium, SiC, or another semiconductor material or compound semiconductor material suitable as a basis for forming ICs. In various embodiments, substrate 110 includes one or more ICs, e.g., IC 202 (FIG. 2), non-limiting examples of which include memory, logic, processor, and communication circuits. In some embodiments, substrate 110 includes a field oxide (not shown) between seal ring 120 and one or more ICs.

Seal ring 120 includes a plurality of dielectric layers 124 within which conductive features are positioned. Top metal layer 122 is positioned in a topmost dielectric layer 124, a plurality of vias 126 are positioned in alternating dielectric layers 124 below the topmost dielectric layer 124, and a plurality of conductive layers 128 are positioned in dielectric layers 124 between the alternating dielectric layers 124 in which the vias are positioned.

Dielectric layers 124 include one or more of silicon dioxide, a low-k dielectric, or another material having mechanical and dielectric properties suitable for formation and support of conductive features.

Top metal layer 122 and top surface 121 include copper. Vias 126 and conductive layers 128 include one or more of copper, aluminum, doped silicon, tungsten, or other conductive materials.

As depicted in FIG. 1, top metal layer 122, vias 126, and conductive layers 128 are arranged within dielectric layers 124 so that seal ring 120 extends continuously in a vertical direction, thereby being capable of providing a barrier against crack propagation. In some embodiments, e.g. the embodiment depicted in FIG. 2 discussed below, seal ring 120 is arranged in a closed loop configuration around a perimeter of a die on substrate 110. In some embodiments, seal ring 120 is arranged along a part of a perimeter of a die on substrate 110.

In the embodiment depicted in FIG. 1, depending on the dielectric layer 124, a given dielectric layer 124 including vias 126 includes one, two, or three vias 126. In some embodiments, a dielectric layer 124 including vias 126 includes greater than three vias 126.

In the embodiment depicted in FIG. 1, a given dielectric layer 124 including conductive layers 128 includes one conductive layer 128. In some embodiments, a dielectric layer 124 including conductive layers 128 includes greater than one conductive layer 128.

In the embodiment depicted in FIG. 1, seal ring 120 includes three dielectric layers 124 that include vias 126. In various embodiments, seal ring 120 includes less than or greater than three dielectric layers 124 that include vias 126.

In the embodiment depicted in FIG. 1, seal ring 120 includes two dielectric layers 124 that include conductive layers 128. In various embodiments, seal ring 120 includes less than or greater than two dielectric layers 124 that include conductive layers 128.

SiC layer 130 includes a bottom surface 131 that directly contacts top surface 121 of top metal layer 122 such that SiC layer 130 is adjacent to top metal layer 122. In some embodiments, SiC layer 130 includes undoped SiC. In some embodiments, SiC layer 130 includes boron or another dopant.

In some embodiments, SiC layer has a thickness ranging from 200 angstroms to 2000 angstroms. In some embodiments, SiC layer has a thickness ranging from 500 angstroms to 1500 angstroms.

Passivation layer 140, also referred to as a lower passivation layer, includes one or more dielectric materials having properties suitable for protecting underlying elements from damage or contamination from environmental moisture, mechanical stress, electrical charge, or radiation. In some embodiments, passivation layer 140 includes one or more of silicon dioxide, undoped silicate glass (USG), silicon nitride ($Si_3N_4$), silicon oxynitride, or another suitable dielectric material.

In the embodiment depicted in FIG. 1, passivation layer 140 includes $Si_3N_4$ layer 142 overlying and adjacent to SiC layer 130, USG layer 144 overlying and adjacent to $Si_3N_4$ layer 142, $Si_3N_4$ layer 146 overlying and adjacent to USG layer 144, and USG layer 148 overlying and adjacent to $Si_3N_4$ layer 146.

In some embodiments, one or both of $Si_3N_4$ layer 142 or $Si_3N_4$ layer 146 has a thickness ranging from 500 angstroms to 1500 angstroms. In some embodiments, one or both of USG layer 144 or USG layer 148 has a thickness ranging from 500 angstroms to 1500 angstroms.

In the embodiment depicted in FIG. 1, passivation layer 140 includes two $Si_3N_4$ layers and two USG layers. In some embodiments, passivation layer 140 includes fewer or greater than two $Si_3N_4$ layers. In some embodiments, passivation layer 140 includes fewer or greater than two USG layers. In some embodiments, passivation layer 140 includes one or more layers (not shown) including a material other than $Si_3N_4$ or USG above, below, between, or instead of one or more of $Si_3N_4$ layer 142, USG layer 144, $Si_3N_4$ layer 146, or USG layer 148.

In some embodiments, passivation layer 140 does not include $Si_3N_4$ layer 142 overlying SiC layer 130, and SiC layer 130 extends from top metal layer 122 to USG layer 144. In some embodiments in which SiC layer 130 extends from top metal layer 122 to USG layer 144, SiC layer 130 has a thickness ranging from 1000 angstroms to 3000 angstroms.

Passivation layer 150, also referred to as an upper passivation layer, includes one or more dielectric materials having properties suitable for protecting underlying elements from damage or contamination from environmental moisture, mechanical stress, electrical charge, or radiation. In some embodiments, passivation layer 150 includes one or more of silicon dioxide, USG, $Si_3N_4$, silicon oxynitride, or another suitable dielectric material.

In some embodiments, passivation layer 150 includes a plurality of layers (not shown) similar to the layers of passivation layer 140, discussed above. In some embodiments, passivation layer 150 includes one or more layers having one or more materials different from the one or more materials included in passivation layer 140.

Sidewall 162 of passivation stack 160 includes a sidewall 132 of SiC layer 130, a sidewall 141 of $Si_3N_4$ layer 142, and a sidewall 152 of passivation layer 150. In the embodiment depicted in FIG. 1, sidewalls 132, 141, and 152 are aligned in a vertical direction such that sidewall 162 has a profile of a substantially straight line.

In some embodiments, sidewall 132 is recessed relative to sidewall 152, indicated by a dashed line in SiC layer 130 in FIG. 1. In some embodiments, sidewall 132 is recessed relative to sidewall 152 by a distance ranging from 50 angstroms to 500 angstroms. In some embodiments, sidewall 132 is recessed relative to sidewall 152 by a distance ranging from 100 angstroms to 300 angstroms. In some embodiments, sidewall 132 is recessed relative to sidewall 152 by a distance determined by an etch process.

In some embodiments in which sidewall 132 is recessed relative to sidewall 152, an area of top surface 121 is expanded compared to embodiments in which sidewall 132 is not recessed relative to sidewall 152, thereby increasing the area available for forming connections, e.g. bump structures, to top surface 121.

In the embodiment depicted in FIG. 1, sidewall 162 includes sidewall 141 of $Si_3N_4$ layer 142. In some embodiments in which passivation layer 140 does not include $Si_3N_4$ layer 142, sidewall 162 does not include sidewall 141, and sidewall 132 is adjacent to sidewall 152. In some embodiments in which passivation layer 140 does not include $Si_3N_4$ layer 142, sidewall 162 includes a sidewall (not labeled) of USG layer 144 between sidewall 132 and sidewall 152.

Sidewall 172 of passivation stack 170 includes a sidewall 134 of SiC layer 130, a sidewall 143 of $Si_3N_4$ layer 142, and a sidewall 154 of passivation layer 150. In the embodiment depicted in FIG. 1, sidewalls 134, 143, and 154 are aligned in a vertical direction such that sidewall 172 has a profile of a substantially straight line.

In some embodiments, sidewall 134 is recessed relative to sidewall 154, indicated by a dashed line in SiC layer 130 in FIG. 1. In some embodiments, sidewall 134 is recessed relative to sidewall 154 by a distance ranging from 50 angstroms to 500 angstroms. In some embodiments, sidewall 134 is recessed relative to sidewall 154 by a distance ranging from 100 angstroms to 300 angstroms. In some embodiments, sidewall 134 is recessed relative to sidewall 154 by a distance determined by an etch process.

In some embodiments in which one or both of sidewall 132 or sidewall 134 is recessed relative to respective sidewall 152 or 154, an area of top surface 121 is expanded compared to embodiments in which neither sidewall 132 nor sidewall 134 is recessed relative to respective sidewall 152 or 154. This expanded area increases the area available for forming connections, e.g. bump structures, to top surface 121.

In the embodiment depicted in FIG. 1, sidewall 172 includes sidewall 143 of $Si_3N_4$ layer 142. In some embodiments in which passivation layer 140 does not include $Si_3N_4$ layer 142, sidewall 172 does not include sidewall 143, and sidewall 134 is adjacent to sidewall 154. In some embodiments in which passivation layer 140 does not include $Si_3N_4$ layer 142, sidewall 172 includes a sidewall (not labeled) of USG layer 144 between sidewall 134 and sidewall 154.

In the embodiment depicted in FIG. 1, trench structure 100 includes sidewall 162 symmetrical to sidewall 172 with respect to a center line (not shown) through trench 180. In some embodiments, sidewalls 162 and 172 are asymmetrical with respect to a center line through trench 180. In some embodiments, sidewall 162 does not include sidewalls 132 and 141, and sidewall 152 is adjacent to top surface 121. In some embodiments, sidewall 172 does not include sidewalls 134 and 143, and sidewall 154 is adjacent to top surface 121.

As discussed above with respect to FIG. 1, trench structure 100 defines a trench 180 that includes at least one sidewall that includes a sidewall of a SiC layer adjacent to a top metal layer. Trench structure 100 is thereby configured so that, compared to trench structures that do not include the SiC layer, improved adhesion of the passivation layers to the top metal layer is provided by the SiC layer. By having improved adhesion to the top metal layer, the passivation layers of trench structure 100 are better able to withstand stresses of manufacturing operations, such as die separation, as compared to passivation layers of trench structures that do not include the SiC layer.

Figure 2:
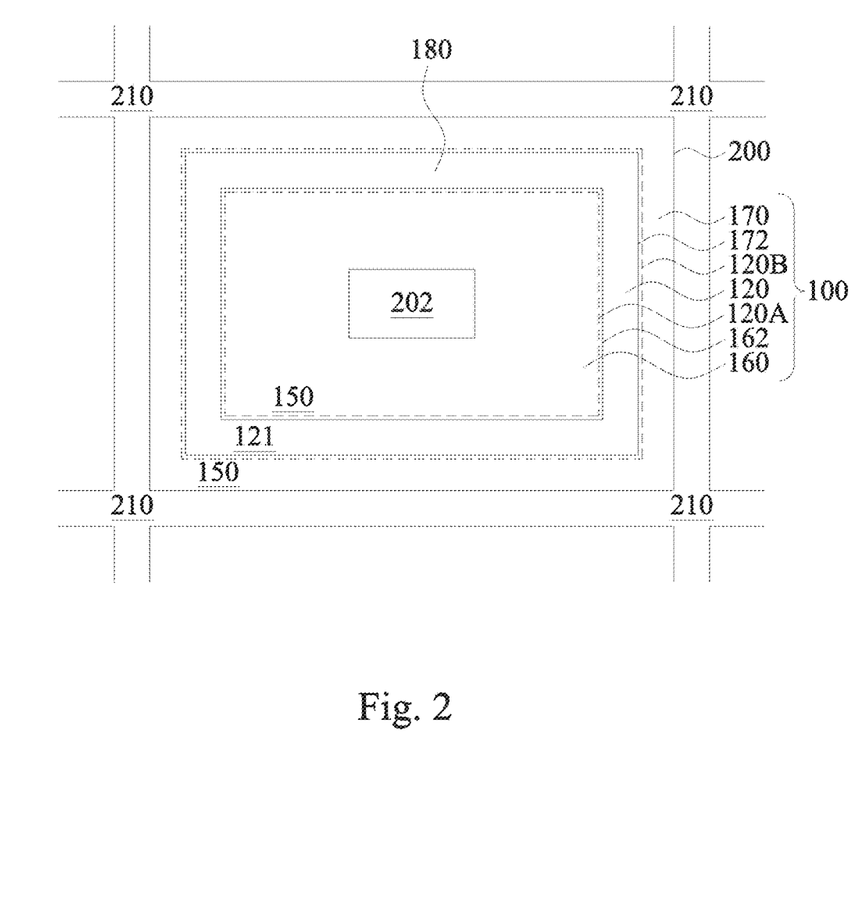
FIG. 2 is a diagram of a trench structure, in accordance with some embodiments.

FIG. 2 is a diagram of trench structure 100, in accordance with some embodiments. FIG. 2 depicts a plan view of trench structure 100, discussed above with respect to FIG. 1, within a die 200 of a plurality of dies separated by scribe lines 210. In addition to trench structure 100, die 200 includes an IC 202.

Other than die 200, individual dies of the plurality of dies are not labeled in FIG. 2. In some embodiments, all dies of the plurality of dies have configurations that match that of die 200. In some embodiments, the plurality of dies includes one or more dies having configurations that differ from that of die 200.

Non-limiting examples of IC 202 include memory, logic, processor, and communication circuits. In various embodiments, IC 202 includes one or more contact pads or other structures (not shown) configured to enable electrical connections to IC 202.

In the embodiment depicted in FIG. 2, seal ring 120 includes an inner contour 120A and an outer contour 120B. As depicted in FIG. 1, inner contour 120A is defined by the leftmost feature of seal ring 120, and outer contour 120B is defined by the rightmost feature of seal ring 120. In various embodiments, one or both of inner contour 120A or outer contour 120B is defined by any one or more of top metal layer 122 or plurality of conductive layers 128.

Inner contour 120A surrounds IC 202 and corresponds to sidewall 162 on passivation stack 160. Outer contour 120B is surrounded by scribe lines 210 and corresponds to sidewall 172 on passivation stack 170. Top surface 121 and sidewalls 162 and 172 thereby form trench 180 in a closed loop configuration over seal ring 120 and around a perimeter of die 200.

In the embodiment depicted in FIG. 2, trench structure 100 includes top surface 121, SiC layer 130, passivation layer 150, and passivation layer 140 (under passivation layer 150 and not labelled), discussed above with respect to FIG. 1, and therefore provides the benefits discussed above with respect to improved adhesion of passivation layers 140 and 150 to top surface 121.

Figure 3:
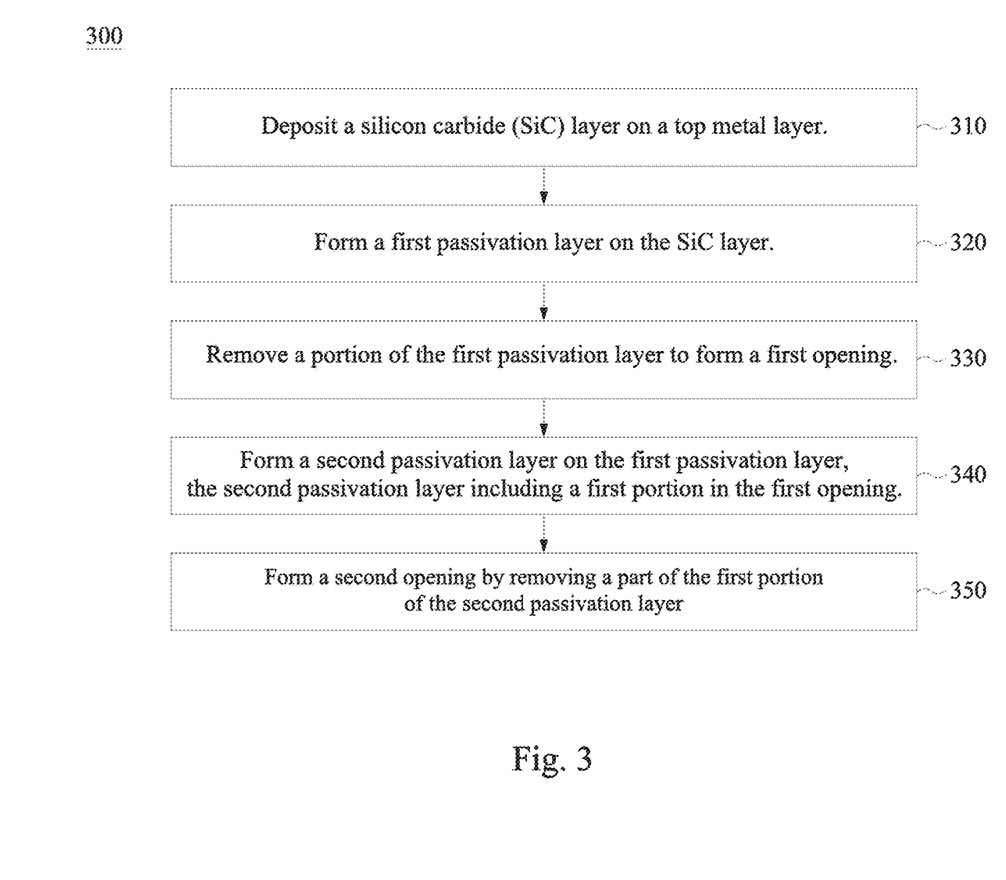
FIG. 3 is a flowchart of a method of forming a trench structure, in accordance with some embodiments.

FIG. 3 is a flowchart of a method 300 of forming a trench structure, e.g., trench structure 100 (FIG. 1), in accordance with one or more embodiments. FIGS. 4A-4E are diagrams of a trench structure 400 at various manufacturing stages corresponding to the operations of method 300, in accordance with some embodiments. Method 300 is operable to form trench structure 100, discussed above with respect to FIGS. 1 and 2, and trench structure 400 is usable as trench structure 100, in some embodiments.

The sequence in which the operations of method 300 are depicted in FIG. 3 is for illustration only; the operations of method 300 are capable of being executed in sequences that differ from that depicted in FIG. 3. In some embodiments, operations in addition to those depicted in FIG. 3 are performed before, between, and/or after the operations depicted in FIG. 3.

Figure 4A:
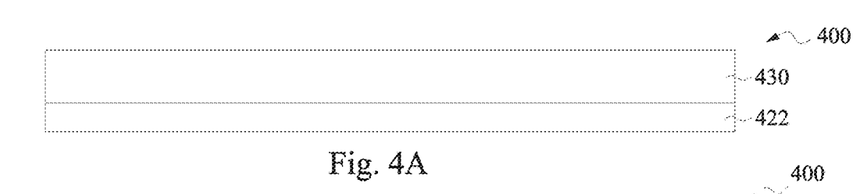
FIGS. 4A-4E are diagrams of a trench structure at various manufacturing stages, in accordance with some embodiments.

At operation 310, a SiC layer 430 is deposited directly on a top metal layer 422, as depicted in FIG. 4A. Top metal layer 422 includes copper. In some embodiments, top metal layer 422 is a top metal layer of a seal ring. In some embodiments, SiC layer 430 and top metal layer 422 are SiC layer 130 and top metal layer 122, respectively, of trench structure 100, discussed above with respect to FIGS. 1 and 2.

In some embodiments, depositing SiC layer 430 includes depositing SiC layer 430 using a chemical vapor deposition (CVD) process or other suitable deposition process. In some embodiments, depositing SiC layer 430 includes depositing SiC layer 430 using a plasma enhanced CVD (PECVD) process.

In some embodiments, depositing SiC layer 430 includes depositing SiC layer 430 to a thickness of 200 angstroms to 2000 angstroms. In some embodiments, depositing SiC layer 430 includes depositing SiC layer 430 to a thickness of 500 angstroms to 1500 angstroms. In some embodiments, depositing SiC layer 430 includes depositing SiC layer 430 to a thickness of 1000 angstroms to 3000 angstroms.

In some embodiments, depositing SiC layer 430 includes doping SiC layer 430 with a dopant. In some embodiments, depositing SiC layer 430 includes doping SiC layer 430 with boron.

Figure 4B:
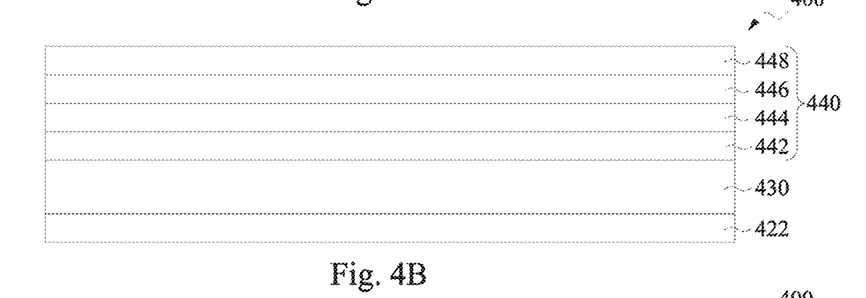

At operation 320, a first passivation layer, passivation layer 440, is formed on SiC layer 430, as depicted in FIG. 4B. In some embodiments, forming passivation layer 440 includes forming passivation layer 440 directly on SiC layer 430. In some embodiments, forming passivation layer 440 includes forming passivation layer 440 on another layer (not shown) overlying SiC layer 430.

In some embodiments, forming passivation layer 440 includes forming a $Si_3N_4$ layer 442, a USG layer 444, a $Si_3N_4$ layer 446, and a USG layer 448, as depicted in FIG. 4B. In some embodiments, forming passivation layer 440 corresponds to forming passivation layer 140 of trench structure 100, discussed above with respect to FIGS. 1 and 2.

In some embodiments, forming passivation layer 440 includes forming one or more layers using a CVD, PECVD, or other deposition process. In some embodiments, forming passivation layer 440 includes forming passivation layer 440 to a thickness of 2500 angstroms to 3500 angstroms. In some embodiments, forming passivation layer 440 includes forming passivation layer 440 to a thickness of approximately 3000 angstroms. In some embodiments, forming passivation layer 440 includes forming each layer of one or more of $Si_3N_4$ layer 442, USG layer 444, $Si_3N_4$ layer 446, or USG layer 448 to a thickness of 500 angstroms to 1500 angstroms.

In some embodiments, forming passivation layer 440 includes forming fewer or greater than two $Si_3N_4$ layers. In some embodiments, forming passivation layer 440 includes forming fewer or greater than two USG layers. In some embodiments, forming first passivation layer 440 includes forming one or more layers (not shown) including a material other than $Si_3N_4$ or USG above, below, between, or instead of one or more of $Si_3N_4$ layer 442, USG layer 444, $Si_3N_4$ layer 446, or USG layer 448.

Figure 4C:
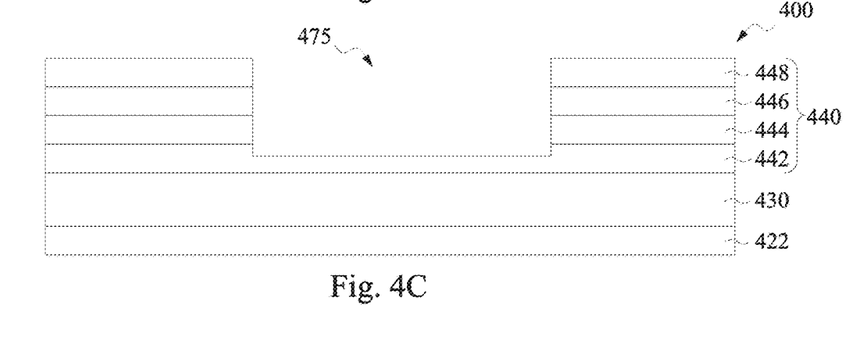

At operation 330, a portion of passivation layer 440 is removed to form a first opening 475, as depicted in FIG. 4C. In some embodiments, removing the portion of passivation layer 440 includes using one or more etch processes such as a wet etch, a dry etch, a sputtering etch or other removal process. In some embodiments, removing the portion of passivation layer 440 includes using one or more etchant materials. In some embodiments, removing the portion of passivation layer 440 includes using one or more of $Cl_2$, $SF_6$, HBr, HCl, $CF_4$, $CHF_3$, $C_2F_6$, $C_4F_8$, or other similar etchant materials.

In some embodiments, removing the portion of passivation layer 440 includes removing part of the thickness of passivation layer 440 to form first opening 475. In some embodiments, removing the portion of passivation layer 440 includes removing an entirety of the thickness of passivation layer 440 and part of the thickness of SiC layer 430 to form first opening 475, thereby exposing SiC layer 430.

In some embodiments, removing the portion of passivation layer 440 includes removing part of the thickness of $Si_3N_4$ layer 442 to form first opening 475, as depicted in FIG. 4C, thereby exposing $Si_3N_4$ layer 442. In some embodiments, removing the portion of passivation layer 440 includes removing an entirety of the thickness of $Si_3N_4$ layer 442 and part of the thickness of SiC layer 430 to form first opening 475, thereby exposing $Si_3N_4$ layer 442 and SiC layer 430.

Figure 4D:
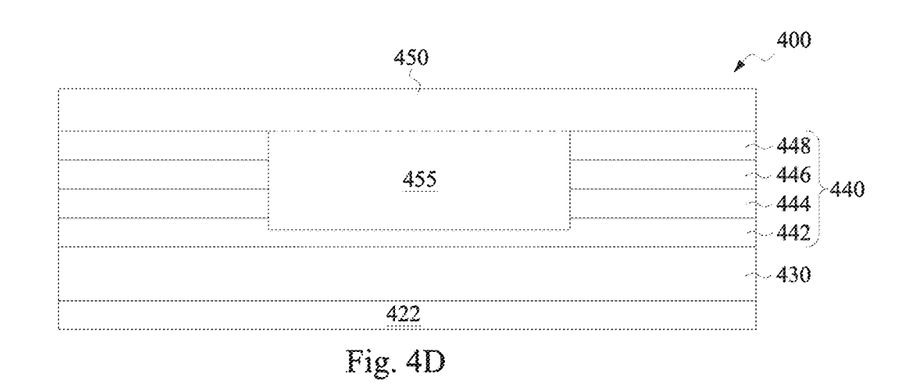

At operation 340, a second passivation layer, passivation layer 450, is formed on passivation layer 440, as depicted in FIG. 4D. Forming passivation layer 450 includes forming a portion 455 of passivation layer 450 in first opening 475. In some embodiments, forming passivation layer 450 corresponds to forming passivation layer 150 of trench structure 100, discussed above with respect to FIGS. 1 and 2.

In some embodiments, forming passivation layer 450 includes forming passivation layer 450 directly on passivation layer 440. In some embodiments, forming passivation layer 450 includes forming passivation layer 450 on another layer (not shown) overlying passivation layer 440.

In some embodiments, forming passivation layer 450 includes forming one or more layers including one or more of silicon dioxide, USG, $Si_3N_4$, silicon oxynitride, or another suitable dielectric material. In some embodiments, forming passivation layer 450 includes forming one or more layers using a CVD, PECVD, or other deposition process. In some embodiments, forming passivation layer 450 includes forming passivation layer 450 to a thickness of 6000 angstroms to 8000 angstroms.

In some embodiments, forming passivation layer 450 includes forming one or more layers (not shown) similar to one or more of $Si_3N_4$ layer 442, USG layer 444, $Si_3N_4$ layer 446, or USG layer 448. In some embodiments, forming passivation layer 450 includes forming one or more layers having one or more materials different from the one or more materials used to form passivation layer 440.

Figure 4E:
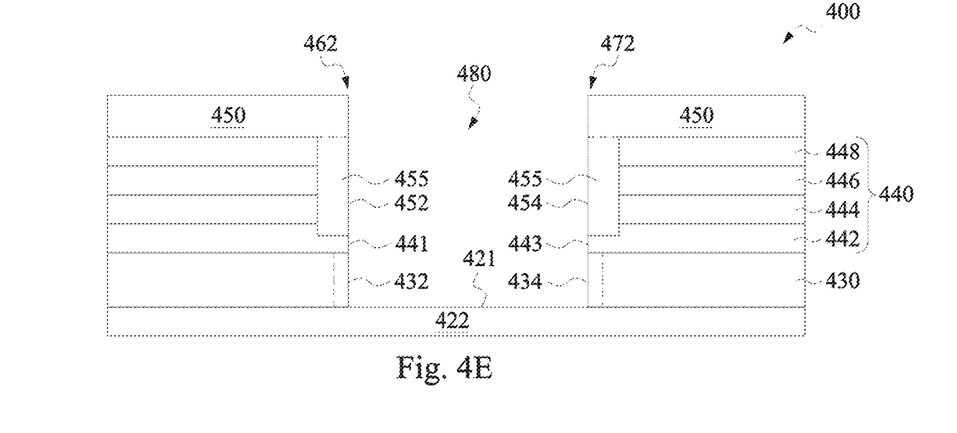

At operation 350, a second opening 480 is formed by removing a part of portion 455, as depicted in FIG. 4E. Forming second opening 480 includes exposing top surface 421 of top metal layer 422. In some embodiments, exposing top surface 421 of top metal layer 422 includes removing an upper thickness of top metal layer 422. In some embodiments, exposing top surface 421 of top metal layer 422 includes removing less than 10 angstroms of an upper thickness of top metal layer 422. In some embodiments, forming second opening 480 corresponds to forming trench 180 of trench structure 100, discussed above with respect to FIGS. 1 and 2.

In some embodiments, forming second opening 480 includes using one or more etch processes such as a wet etch, a dry etch, a sputtering etch, or other removal process. In some embodiments, forming second opening 480 includes using one or more etchant materials. In some embodiments, forming second opening 480 includes using one or more of $Cl_2$, $SF_6$, HBr, HCl, $CF_4$, $CHF_3$, $C_2F_6$, $C_4F_8$, or other similar etchant materials.

In some embodiments, forming second opening 480 includes removing an entirety of the thickness of SiC layer 430 to expose top metal layer 422. In some embodiments, forming second opening 480 includes removing part of the thickness of SiC layer 430 to expose top metal layer 422.

In some embodiments, forming second opening 480 includes removing part of the thickness of passivation layer 440, thereby exposing passivation layer 440. In some embodiments, forming second opening 480 includes removing part of the thickness of $Si_3N_4$ layer 442, thereby exposing passivation layer 440.

In some embodiments, forming second opening 480 includes removing a portion of SiC layer 430 with a same etchant material used to remove a portion of one or both of passivation layers 440 or 450. In some embodiments, forming second opening 480 includes removing a portion of SiC layer 430 with an etchant material different from one or more etchant materials used to remove one or more portions of passivation layers 440 or 450.

Forming second opening 480 includes forming sidewalls 462 and 472, as depicted in FIG. 4E. In some embodiments, forming sidewalls 462 and 472 corresponds to forming sidewalls 162 and 172, respectively, of trench structure 100, discussed above with respect to FIGS. 1 and 2.

Forming sidewall 462 includes forming a sidewall 432 of SiC layer 430, a sidewall 441 of $Si_3N_4$ layer 442, and a sidewall 452 of passivation layer 450. In the embodiment depicted in FIG. 4E, sidewalls 432, 441, and 452 are formed so as to be aligned in a vertical direction such that sidewall 462 has a profile of a substantially straight line.

Forming sidewall 472 includes forming a sidewall 434 of SiC layer 430, a sidewall 443 of $Si_3N_4$ layer 442, and a sidewall 454 of passivation layer 450. In the embodiment depicted in FIG. 4E, sidewalls 434, 443, and 454 are formed so as to be aligned in a vertical direction such that sidewall 472 has a profile of a substantially straight line.

In some embodiments, sidewalls 432 and 434 are formed to be recessed relative to sidewalls 452 and 454, respectively, indicated by dashed lines in SiC layer 430 in FIG. 4E. In some embodiments, sidewalls 432 and 434 are recessed relative to respective sidewalls 452 and 454 by a distance ranging from 50 angstroms to 500 angstroms. In some embodiments, sidewalls 432 and 434 are recessed relative to respective sidewalls 452 and 454 by a distance ranging from 100 angstroms to 300 angstroms.

In some embodiments, sidewalls 432, 434, 441, and 443 are formed in a same etching process. In some embodiments, forming sidewalls 432 and 434 to be recessed relative to respective sidewalls 452 and 454 is part of a same etching process for forming sidewalls 432, 434, 441, and 443. In some embodiments, sidewalls 432 and 434 are formed in an etching process different from an etching process used to form sidewalls 441 and 443. In some embodiments, forming sidewalls 432 and 434 to be recessed relative to respective sidewalls 452 and 454 is part of an etching process for forming sidewalls 432 and 434 different from an etching process for forming sidewalls 441 and 443.

In some embodiments in which sidewalls 432 and 434 are formed to be recessed relative to respective sidewalls 452 and 454, the exposed area of top surface 421 is expanded compared to embodiments in which sidewalls 432 and 434 are not recessed relative to respective sidewalls 452 and 454. This expanded area increases the area available for forming connections, e.g. bump structures, to top surface 421.

In the embodiment depicted in FIG. 4E, forming sidewalls 462 and 472 includes forming sidewalls 441 and 443 of $Si_3N_4$ layer 142. In some embodiments in which passivation layer 440 does not include $Si_3N_4$ layer 442, forming sidewalls 462 and 472 does not include forming sidewalls 441 and 443. In some embodiments in which passivation layer 440 does not include $Si_3N_4$ layer 442, forming sidewalls 462 and 472 includes forming sidewalls (not labeled) of USG layer 444.

In the embodiment depicted in FIG. 4E, forming second opening 480 includes forming sidewalls 462 and 472 from portion 455 such that sidewalls 462 and 472 are symmetrical with respect to a center line (not shown) through second opening 480. In some embodiments, forming second opening 480 includes removing an additional amount, or all, of portion 455 such that sidewall 462 does not include sidewall 452 and/or sidewall 472 does not include sidewall 454.

The operations of method 300 are usable to form a trench structure that includes at least one sidewall that includes a sidewall of a SiC layer adjacent to a top metal layer. Compared to methods that do not include forming the SiC layer, method 300 is usable to from trench structures with improved adhesion of the passivation layers to the top metal layer provided by the SiC layer. By having improved adhesion to the top metal layer, the passivation layers of trench structures formed using method 300 are better able to withstand stresses of manufacturing operations, such as die separation, as compared to passivation layers of trench structures formed using methods that do not include forming the SiC layer.

One aspect of this description relates to a method of forming a trench structure. The method includes depositing a silicon carbide (SiC) layer on a top metal layer, forming a first passivation layer on the SiC layer, removing a portion of the first passivation layer to form a first opening, and forming a second passivation layer on the first passivation layer, the second passivation layer including a first portion in the first opening. The method also includes forming a second opening by removing a part of the first portion of the second passivation layer. Forming the second opening exposes the top metal layer. In some embodiments, removing the portion of the first passivation layer to form the first opening exposes a silicon nitride ($Si_3N_4$) layer of the first passivation layer. In some embodiments, forming the second opening exposes the SiC layer. In some embodiments, forming the second opening exposes the first passivation layer. In some embodiments, depositing the SiC layer includes depositing the SiC layer to a thickness of 500 angstroms to 1500 angstroms. In some embodiments, depositing the SiC layer includes depositing the SiC layer using chemical vapor deposition (CVD) or plasma enhanced CVD (PECVD). In some embodiments, depositing the SiC layer includes doping the SiC layer with a dopant.

Another aspect of this description relates to a method of forming a trench structure. The method includes depositing a silicon carbide (SiC) layer on a top metal layer, depositing a first passivation layer on the SiC layer, forming a first opening by removing a portion of the first passivation layer, forming a second passivation layer on the first passivation layer. The second passivation layer fills the first opening. The method also includes forming a second opening extending through the second passivation layer, the first passivation layer, and the SiC layer. The second opening exposes sidewalls of the second passivation layer, sidewalls of the first passivation layer, and sidewalls of the SiC layer. The method further includes recessing the sidewalls of the SiC layer relative to the sidewalls of the first passivation layer. In some embodiments, forming the second opening includes removing a portion of the second passivation layer in the first opening, and a portion of the first passivation layer and a portion of the SiC layer underlying the portion of the second passivation layer in the first opening. In some embodiments, the sidewalls of the second passivation layer are vertically aligned with portions of the sidewalls of the first passivation layer adjacent to the sidewalls of the SiC layer. In some embodiments, forming the second opening includes forming the second opening having a dimension less than a dimension of the first opening. In some embodiments, forming the second opening exposes a surface of the top metal layer. In some embodiments, exposing the surface of the top metal layer includes removing a portion of the top metal layer. In some embodiments, exposing the surface of the top metal layer includes removing less than 10 angstroms of a portion of the top metal layer.

Still another aspect of this description relates to a method of forming a trench structure over a seal ring. The method includes depositing a silicon carbide (SiC) layer on a top metal layer of the seal ring, forming a first passivation layer on the SiC layer, forming a first opening extending through at least a portion of the first passivation layer, forming a second passivation layer on the first passivation layer, the second passivation layer including a first portion in the first opening, and etching the first portion of the second passivation layer, the first passivation layer, and the SiC layer to form a second opening. The second opening exposes a portion of a sidewall of the first passivation layer and a sidewall of the second passivation layer, and another portion of the sidewall of the first passivation layer is covered by the second passivation layer. In some embodiments, forming the first passivation layer comprises forming alternating silicon nitride ($Si_3N_4$) layers and undoped silicate glass (USG) layers with a $Si_3N_4$ layer adjacent to the SiC layer. In some embodiments, forming the first opening includes removing a portion of the $Si_3N_4$ layer adjacent to the SiC layer. In some embodiments, forming the second passivation layer includes forming the second passivation layer directly on the first passivation layer. In some embodiments, forming the second passivation layer includes depositing silicon dioxide, USG, $Si_3N_4$, silicon oxynitride, or combinations thereof. In some embodiments, etching the first portion of the second passivation layer, the first passivation layer, and the SiC layer to form the second opening includes forming the second opening enclosed by the first opening.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a trench structure, the method comprising:
   depositing a silicon carbide (SiC) layer on a top metal layer;
   forming a first passivation layer on the SiC layer;
   removing a portion of the first passivation layer to form a first opening;
   forming a second passivation layer on the first passivation layer, the second passivation layer including a first portion in the first opening; and
   forming a second opening by removing a part of the first portion of the second passivation layer,
   wherein forming the second opening exposes the top metal layer.

2. The method of claim 1, wherein removing the portion of the first passivation layer to form the first opening exposes a silicon nitride ($Si_3N_4$) layer of the first passivation layer.

3. The method of claim 1, wherein forming the second opening exposes the SiC layer.

4. The method of claim 1, wherein forming the second opening exposes the first passivation layer.

5. The method of claim 1, wherein depositing the SiC layer comprises depositing the SiC layer to a thickness of 500 angstroms to 1500 angstroms.

6. The method of claim 1, wherein depositing the SiC layer comprises depositing the SiC layer using chemical vapor deposition (CVD) or plasma enhanced CVD (PECVD).

7. The method of claim 1, wherein depositing the SiC layer comprises doping the SiC layer with a dopant.

8. A method of forming a trench structure, the method comprising:
   depositing a silicon carbide (SiC) layer on a top metal layer;
   depositing a first passivation layer on the SiC layer;
   forming a first opening by removing a portion of the first passivation layer;
   forming a second passivation layer on the first passivation layer, wherein the second passivation layer fills the first opening;
   forming a second opening extending through the second passivation layer, the first passivation layer, and the SiC layer, wherein the second opening exposes sidewalls of the second passivation layer, sidewalls of the first passivation layer, and sidewalls of the SiC layer; and
   recessing the sidewalls of the SiC layer relative to the sidewalls of the first passivation layer.

9. The method of claim 8, wherein forming the second opening comprises removing a portion of the second passivation layer in the first opening, and a portion of the first passivation layer and a portion of the SiC layer underlying the portion of the second passivation layer in the first opening.

10. The method of claim 8, wherein the sidewalls of the second passivation layer are vertically aligned with the sidewalls of the first passivation layer.

11. The method of claim 8, wherein forming the second opening comprises forming the second opening having a dimension less than a dimension of the first opening.

12. The method of claim 8, wherein forming the second opening exposes a surface of the top metal layer.

13. The method of claim 12, wherein exposing the surface of the top metal layer comprises removing a portion of the top metal layer.

14. The method of claim 12, wherein exposing the surface of the top metal layer comprises removing less than 10 angstroms of a portion of the top metal layer.

15. A method of forming a trench structure over a seal ring, the method comprising:
   depositing a silicon carbide (SiC) layer on a top metal layer of the seal ring;
   forming a first passivation layer on the SiC layer;
   forming a first opening extending through at least a portion of the first passivation layer;
   forming a second passivation layer on the first passivation layer, the second passivation layer including a first portion in the first opening; and
   etching the first portion of the second passivation layer, the first passivation layer, and the SiC layer to form a second opening, wherein the second opening exposes a portion of a sidewall of the first passivation layer and a sidewall of the second passivation layer, wherein another portion of the sidewall of the first passivation layer is covered by the second passivation layer.

16. The method of claim 15, wherein forming the first passivation layer comprises forming alternating silicon nitride ($Si_3N_4$) layers and undoped silicate glass (USG) layers with a $Si_3N_4$ layer adjacent to the SiC layer.

17. The method of claim 16, wherein forming the first opening comprises removing a portion of the $Si_3N_4$ layer adjacent to the SiC layer.

18. The method of claim 15, wherein forming the second passivation layer comprises forming the second passivation layer directly on the first passivation layer.

19. The method of claim 15, wherein forming the second passivation layer comprises depositing silicon dioxide, USG, $Si_3N_4$, silicon oxynitride, or combinations thereof.

20. The method of claim 15, wherein etching the first portion of the second passivation layer, the first passivation layer, and the SiC layer to form the second opening comprises forming the second opening enclosed by the first opening.

* * * * *